United States Patent
Ramer et al.

(10) Patent No.: US 8,217,406 B2
(45) Date of Patent: Jul. 10, 2012

(54) SOLID STATE LIGHT EMITTER WITH PUMPED NANOPHOSPHORS FOR PRODUCING HIGH CRI WHITE LIGHT

(75) Inventors: David P. Ramer, Reston, VA (US); Jack C. Rains, Jr., Herndon, VA (US)

(73) Assignee: ABL IP Holding LLC, Conyers, GA (US)

( * ) Notice: Subject to any disclaimer, the term of this patent is extended or adjusted under 35 U.S.C. 154(b) by 0 days.

(21) Appl. No.: 12/629,599

(22) Filed: Dec. 2, 2009

(65) Prior Publication Data

US 2010/0258828 A1    Oct. 14, 2010

(51) Int. Cl.
    H01L 29/20    (2006.01)
(52) U.S. Cl. ............. 257/89; 257/98; 257/99; 257/100; 257/102; 257/103
(58) Field of Classification Search .......... None
    See application file for complete search history.

(56) References Cited

U.S. PATENT DOCUMENTS

| | | | |
|---|---|---|---|
| 5,608,213 A | 3/1997 | Pinkus et al. | |
| 5,637,258 A | 6/1997 | Goldburt et al. | |
| 5,803,592 A | 9/1998 | Lawson | |
| 5,877,490 A | 3/1999 | Ramer et al. | |
| 5,914,487 A | 6/1999 | Ramer et al. | |
| 6,007,225 A | 12/1999 | Ramer et al. | |
| 6,036,886 A | 3/2000 | Chhabra et al. | |
| 6,222,623 B1 | 4/2001 | Wetherell | |
| 6,234,648 B1 | 5/2001 | Borner et al. | |
| 6,286,979 B1 | 9/2001 | Ramer et al. | |
| 6,357,889 B1 | 3/2002 | Duggal et al. | |
| 6,361,192 B1 | 3/2002 | Fussell et al. | |
| 6,422,718 B1 | 7/2002 | Anderson et al. | |
| 6,437,861 B1 | 8/2002 | Kuta | |

(Continued)

FOREIGN PATENT DOCUMENTS

WO    WO 2009/146262 A1    12/2009

OTHER PUBLICATIONS

Pradhan, Narayan, et al., "An Alternative of CdSe Nanocrystal Emitters: Pure and Tunable Impurity Emissions in ZnSe Nonocrystals", Nov. 24, 2005, 127, pp. 17586-17587, J. A, Chem, Soc. Communications, web publication.

(Continued)

Primary Examiner — David E Graybill
(74) Attorney, Agent, or Firm — McDermott Will & Emery LLP

(57) ABSTRACT

A solid state white light emitting device includes a semiconductor chip producing near ultraviolet (UV) electromagnetic energy in a range of 380-420 nm, e.g. 405 nm. The device may include a reflector forming and optical integrating cavity. Phosphors, such as doped semiconductor nanophosphors, within the chip packaging of the semiconductor device itself, are excitable by the near UV energy. However the re-emitted light from the phosphors have different spectral characteristics outside the absorption ranges of the phosphors, which reduces or eliminates re-absorption. The emitter produces output light that is at least substantially white and has a color rendering index (CRI) of 75 or higher. The white light output of the emitter may exhibit color temperature in one of the following specific ranges along the black body curve: 2,725±145° Kelvin; 3,045±175° Kelvin; 3,465±245° Kelvin; 3,985±275° Kelvin; 4,503±243° Kelvin; 5,028±283° Kelvin; 5,665±355° Kelvin; and 6,530±510° Kelvin.

17 Claims, 6 Drawing Sheets

| Color Temp. Range (° Kelvin) | Nominal Color Temp. (° Kelvin) |
|---|---|
| 2725 ± 145 | 2700 |
| 3045 ± 175 | 3000 |
| 3465 ± 245 | 3500 |
| 3985 ± 275 | 4000 |
| 4503 ± 243 | 4500 |
| 5028 ± 283 | 5000 |
| 5665 ± 355 | 5700 |
| 6530 ± 510 | 6500 |

Color Temperature Ranges and Corresponding Nominal Color Temperatures

U.S. PATENT DOCUMENTS

| | | |
|---|---|---|
| 6,447,698 B1 | 9/2002 | Ihara et al. |
| 6,473,554 B1 | 10/2002 | Pelka et al. |
| 6,536,914 B2 | 3/2003 | Hoelen et al. |
| 6,566,824 B2 | 5/2003 | Panagotacos et al. |
| 6,692,136 B2 | 2/2004 | Marshall et al. |
| 6,700,112 B2 | 3/2004 | Brown |
| 6,734,465 B1 | 5/2004 | Taskar et al. |
| 6,737,681 B2 | 5/2004 | Koda |
| 6,836,083 B2 | 12/2004 | Mukai |
| 6,869,545 B2 | 3/2005 | Peng et al. |
| 6,872,249 B2 | 3/2005 | Peng et al. |
| 6,960,872 B2 | 11/2005 | Beeson et al. |
| 6,969,843 B1 | 11/2005 | Beach et al. |
| 6,985,163 B2 | 1/2006 | Riddle et al. |
| 6,995,355 B2 | 2/2006 | Rains, Jr. et al. |
| 7,025,464 B2 | 4/2006 | Beeson et al. |
| 7,040,774 B2 | 5/2006 | Beeson et al. |
| 7,102,152 B2 | 9/2006 | Chua et al. |
| 7,105,051 B2 | 9/2006 | Peng et al. |
| 7,144,131 B2 | 12/2006 | Rains |
| 7,148,632 B2 | 12/2006 | Berman et al. |
| 7,153,703 B2 | 12/2006 | Peng et al. |
| 7,160,525 B1 | 1/2007 | Peng et al. |
| 7,175,778 B1 | 2/2007 | Bhargava et al. |
| 7,192,850 B2 | 3/2007 | Chen et al. |
| 7,220,039 B2 | 5/2007 | Ahn et al. |
| 7,235,190 B1 | 6/2007 | Wilcoxon et al. |
| 7,235,792 B2 | 6/2007 | Elofson |
| 7,273,904 B2 | 9/2007 | Peng et al. |
| 7,294,956 B2 | 11/2007 | Maeda et al. |
| 7,350,933 B2 | 4/2008 | Ng et al. |
| 7,374,807 B2 | 5/2008 | Parce et al. |
| 7,525,094 B2 | 4/2009 | Cooke et al. |
| 7,531,149 B2 | 5/2009 | Peng et al. |
| 7,547,888 B2 | 6/2009 | Cooke et al. |
| 7,560,677 B2 | 7/2009 | Lyons et al. |
| 7,679,060 B2 | 3/2010 | McKigney et al. |
| 7,768,192 B2 | 8/2010 | Van De Ven et al. |
| 2004/0126582 A1 | 7/2004 | Ng et al. |
| 2004/0135504 A1 | 7/2004 | Tamaki et al. |
| 2004/0151008 A1 | 8/2004 | Artsyukhovich et al. |
| 2004/0188594 A1 | 9/2004 | Brown et al. |
| 2006/0068154 A1 | 3/2006 | Parce et al. |
| 2006/0072314 A1 | 4/2006 | Rains |
| 2006/0203468 A1 | 9/2006 | Beeson et al. |
| 2007/0024191 A1 | 2/2007 | Chen et al. |
| 2007/0034833 A1 | 2/2007 | Parce et al. |
| 2007/0045524 A1 | 3/2007 | Rains, Jr. et al. |
| 2007/0051883 A1 | 3/2007 | Rains, Jr. et al. |
| 2007/0138978 A1 | 6/2007 | Rains, Jr. et al. |
| 2007/0170454 A1 | 7/2007 | Andrews |
| 2008/0030974 A1 | 2/2008 | Abu-Ageel |
| 2008/0084706 A1 | 4/2008 | Roshan et al. |
| 2008/0093557 A1 | 4/2008 | Cooke et al. |
| 2008/0094835 A1 | 4/2008 | Marra et al. |
| 2008/0106887 A1 | 5/2008 | Salsbury et al. |
| 2008/0128624 A1 | 6/2008 | Cooke et al. |
| 2008/0191168 A1 | 8/2008 | McKigney et al. |
| 2008/0224025 A1 | 9/2008 | Lyons et al. |
| 2008/0291670 A1 | 11/2008 | Rains |
| 2009/0003002 A1 | 1/2009 | Sato |
| 2009/0251884 A1 | 10/2009 | Rains |
| 2009/0295266 A1 | 12/2009 | Ramer et al. |
| 2009/0296368 A1 | 12/2009 | Ramer |
| 2009/0302195 A1 | 12/2009 | Muenchausen et al. |
| 2009/0315047 A1 | 12/2009 | Naum et al. |
| 2010/0051898 A1 | 3/2010 | Kim et al. |
| 2010/0109036 A1 | 5/2010 | Chen et al. |
| 2010/0258828 A1 | 10/2010 | Ramer et al. |
| 2010/0259917 A1* | 10/2010 | Ramer et al. .......... 362/84 |
| 2010/0276638 A1 | 11/2010 | Liu et al. |
| 2010/0277904 A1* | 11/2010 | Hanley et al. .......... 362/235 |
| 2010/0277907 A1* | 11/2010 | Phipps et al. .......... 362/235 |
| 2011/0127555 A1 | 6/2011 | Rains et al. |
| 2011/0127557 A1 | 6/2011 | Ramer et al. |
| 2011/0133182 A1* | 6/2011 | Saito et al. .......... 257/43 |
| 2011/0240960 A1 | 10/2011 | Kim et al. |

OTHER PUBLICATIONS

"Energy Star Program Requirements for Solid State Lighting Luminaires Eligibility Criteria—Version 1.0", Manual, Sep. 12, 2007.

Yin, Yadong and A. Paul Alivisatos, "Colloidal nanocrystal sythesis and the organic-inorganic interface", Insight Review, Sep. 25, 2005, pp. 664-670, Nature vol. 437.

"Final Report: Highly Bright, Heavy Metal-Free, and Stable Doped Semiconductor Nanophosphors for Economical Solid State Lighting Alternatives", Report, Nov. 12, 2009, pp. 1-3, National Center for Environmental Research, web publication.

"Solid-State Lighting: Development of White LEDs Using Nanophosphor-InP Blends", Report, Oct. 26, 2009, p. 1, U.S. Department of Energy—Energy Efficiency and Renewable Energy, web publication.

"Solid-State Lighting: Improved Light Extraction Efficiencies of White pc-LEDs for SSL by Using Non-Toxic, Non-Scattering, Bright, and Stable Doped ZnSe Quantum Dot Nanophosphors (Phase I)", Report, Oct. 26, 2009, pp. 1-2, U.S. Department of Energy—Energy Efficiency and Renewable Energy, web publication.

"Chemistry—All in the Dope", Editor's Choice, Dec. 9, 2005, Science, vol. 310, p. 1, AAAS, web publication.

"D-dots: Heavy Metal Free Doped Semiconductor Nanocrystals", Technical Specifications, etc. Dec. 1, 2009, pp. 1-2, NN-Labs, LLC (Nanomaterials & Nanofabrication Laboratories), CdSe/ZnS Semiconductor Nanocrystals, web publication.

United States Office Action issued in U.S. Appl. No. 12/840,807 dated Aug. 30, 2011.

United States Office Action issued in U.S. Appl. No. 12/840,807 dated Nov 22, 2011.

V. Wood et al., "Colloidal quantum dot light-emitting devices," Google Scholar, Jul. 7, 2010, XP002660106, Retrieved from the internet: URL: http://www.nano-reviews.net/index.php/nano/article/viewArticle/5202/5767 [retrieved on Sep. 23, 2011].

International Search Report issued in International Patent Application No. PCT/US2011/043125 dated Nov. 8, 2011.

United States Office Action issued in U.S. Appl. No. 12/840,807 dated Nov. 22, 2011.

* cited by examiner

| Color Temp. Range (° Kelvin) | Nominal Color Temp. (° Kelvin) |
|---|---|
| 2725 ± 145 | 2700 |
| 3045 ± 175 | 3000 |
| 3465 ± 245 | 3500 |
| 3985 ± 275 | 4000 |
| 4503 ± 243 | 4500 |
| 5028 ± 283 | 5000 |
| 5665 ± 355 | 5700 |
| 6530 ± 510 | 6500 |

Color Temperature Ranges and
Corresponding Nominal Color Temperatures

FIG. 4A

| CCT Range | 2725 ± 145 | | 3045 ± 175 | | 3465 ± 245 | | 3985 ± 275 | |
|---|---|---|---|---|---|---|---|---|
| Nominal CCT | 2700° K | | 3000° K | | 3500° K | | 4000° K | |
|  | x | y | x | y | x | y | x | y |
| Center point | 0.4578 | 0.4101 | 0.4338 | 0.4030 | 0.4073 | 0.3917 | 0.3818 | 0.3797 |
|  | 0.4813 | 0.4319 | 0.4562 | 0.4260 | 0.4299 | 0.4165 | 0.4006 | 0.4044 |
| Tolerance | 0.4562 | 0.4260 | 0.4299 | 0.4165 | 0.3996 | 0.4015 | 0.3736 | 0.3874 |
| Quadrangle | 0.4373 | 0.3893 | 0.4147 | 0.3814 | 0.3889 | 0.3690 | 0.3670 | 0.3578 |
|  | 0.4593 | 0.3944 | 0.4373 | 0.3893 | 0.4147 | 0.3814 | 0.3898 | 0.3716 |

Chromaticity Specification for the Four Nominal Values/CCT Ranges

FIG. 4B

| CCT Range | 4503 ± 243 | | 5028 ± 283 | | 5665 ± 355 | | 6530 ± 510 | |
|---|---|---|---|---|---|---|---|---|
| Nominal CCT | 4500° K | | 5000° K | | 5700° K | | 6500° K | |
|  | x | y | x | y | x | y | x | y |
| Center point | 0.3611 | 0.3658 | 0.3447 | 0.3553 | 0.3287 | 0.3417 | 0.3123 | 0.3282 |
|  | 0.3736 | 0.3874 | 0.3551 | 0.3760 | 0.3376 | 0.3616 | 0.3205 | 0.3481 |
| Tolerance | 0.3548 | 0.3736 | 0.3376 | 0.3616 | 0.3207 | 0.3462 | 0.3028 | 0.3304 |
| Quadrangle | 0.3512 | 0.3465 | 0.3366 | 0.3369 | 0.3222 | 0.3243 | 0.3068 | 0.3113 |
|  | 0.3670 | 0.3578 | 0.3515 | 0.3487 | 0.3366 | 0.3369 | 0.3221 | 0.3261 |

Chromaticity Specification for the Four Nominal Values/CCT Ranges

SOLID STATE LIGHT EMITTER WITH PUMPED NANOPHOSPHORS FOR PRODUCING HIGH CRI WHITE LIGHT

TECHNICAL FIELD

The present subject matter relates to solid state devices constructed to produce perceptible white light of a desirable color or spectral characteristic, for example for general lighting applications, using energy in a range of 380-420 nm to pump phosphors, e.g. doped semiconductor nanophosphors, for converting such energy into visible white light, with a color rendering index (CRI) of 75 or higher and/or with a color temperature in one of several specific disclosed regions along the black body curve which provide a desirable quality of white light particularly for general lighting applications and the like.

BACKGROUND

As costs of energy increase along with concerns about global warming due to consumption of fossil fuels to generate energy, there is an every increasing need for more efficient lighting technologies. These demands, coupled with rapid improvements in semiconductors and related manufacturing technologies, are driving a trend in the lighting industry toward the use of light emitting diodes (LEDs) or other solid state light sources to produce light for general lighting applications, as replacements for incandescent lighting and eventually as replacements for other older less efficient light sources.

The actual solid state light sources, however, produce light of specific limited spectral characteristics. To obtain white light of a desired characteristic and/or other desirable light colors, one approach uses sources that produce light of two or more different colors or wavelengths and one or more optical processing elements to combine or mix the light of the various wavelengths to produce the desired characteristic in the output light. In recent years, techniques have also been developed to shift or enhance the characteristics of light generated by solid state sources using phosphors, including for generating white light using LEDs. Phosphor based techniques for generating white light from LEDs, currently favored by LED manufacturers, include UV or Blue LED pumped phosphors. In addition to traditional phosphors, semiconductor nanophosphors have been used more recently. The phosphor materials may be provided as part of the LED package (on or in close proximity to the actual semiconductor chip), or the phosphor materials may be provided remotely (e.g. on or in association with a macro optical processing element such as a diffuser or reflector outside the LED package).

Although these solid state lighting technologies have advanced considerably in recent years, there is still room for further improvement. For example, there is always a need for techniques to still further improve efficiency of solid state lighting fixtures or systems, to reduce energy consumption. Also, for general lighting applications, it is desirable to provide light outputs of acceptable characteristics (e.g. white light of a desired color temperature and/or color rendering index).

SUMMARY

From a first perspective teachings herein provide further improvements over the existing technologies using a near ultra violet emitter chip and phosphors, e.g. doped semiconductor nanophosphors, for providing light that is at least substantially white, has a high CRI and/or exhibits a desirable color temperature characteristic.

An exemplary solid state light emitting device might include a semiconductor chip and a plurality of doped semiconductor nanophosphors within the package enclosing the semiconductor chip. The semiconductor chip is of a type for producing near UV electromagnetic energy, specifically in a range of 380-420 nm. Each of the doped semiconductor nanophosphors within the device is of a type excited in response to near UV electromagnetic energy in the range of 380-420 nm. Each of the remote doped semiconductor nanophosphors is of a type for re-emitting visible light of a different spectrum outside (having substantially no overlap with) the absorption spectra of the semiconductor nanophosphors. When excited by near UV electromagnetic energy from the semiconductor chip, the doped semiconductor nanophosphors together produce visible light in the output of the device. The resulting visible light output is at least substantially white and has a color rendering index (CRI) of 75 or higher. In this example, the visible light output produced during the near UV excitation of the doped semiconductor nanophosphors also exhibits a color temperature in one of the following ranges along the black body curve: $2,725\pm145°$ Kelvin; $3,045\pm175°$ Kelvin; $3,465\pm245°$ Kelvin; $3,985\pm275°$ Kelvin; $4,503\pm243°$ Kelvin; $5,028\pm283°$ Kelvin; $5,665\pm355°$ Kelvin; and $6,530\pm510°$ Kelvin.

In a specific example, the semiconductor chip is configured for producing electromagnetic energy of 405 nm. The phosphors within the device package include a doped semiconductor nanophosphor of a type excited for re-emitting orange light, a doped semiconductor nanophosphor of a type for re-emitting blue light, and a doped semiconductor nanophosphor of a type for re-emitting green light. In such a case, the visible light output produced during the near UV excitation of the doped semiconductor nanophosphors has a CRI of at least 80. A doped semiconductor nanophosphor of a type for re-emitting yellowish-green or greenish-yellow light may be added to further increase the CRI.

In another example, the remote doped semiconductor nanophosphors include red, green, blue and yellow emitting nanophosphors, excited in response to near UV electromagnetic energy in the range of 380-420 nm. In such a case, the visible light output produced during the near UV excitation of the doped semiconductor nanophosphors has a CRI of at least 88.

The near UV pumping of doped semiconductor nanophosphors provides a relatively efficient mechanism to produce the desired white light output. The selection of the parameters of the UV energy for pumping the phosphors, and the selection of the doped semiconductor nanophosphors to emit light having CRI in the specified range and color temperature in one of the particular ranges provides white light that is highly useful, desirable and acceptable, particularly for many general lighting applications.

The near UV semiconductor and the semiconductor nanophosphors may be utilized in any of a wide range of device designs, including those known for LED type devices.

In a new example disclosed in the detailed description and drawings, a solid state light emitting device of the type discussed herein also includes at least one diffusely reflective surface within the package forming an optical integrating cavity. The semiconductor chip is positioned and oriented so that at least substantially all direct emissions from the semiconductor chip reflect at least once within the cavity.

The optical integrating cavity may be filled with a light transmissive solid. A surface of the light transmissive solid forms an optical aperture of the optical integrating cavity as the output of the device. The nanophosphors may be deployed within the package in a variety of different ways, for example, in or on the reflective surface. However, in the illustrated example having the cavity, the doped semiconductor nanophosphors are embedded or otherwise contained in the light transmissive solid. The semiconductor chip is positioned and oriented relative to the light transmissive solid so that any near UV electromagnetic energy reaching the surface of the light transmissive solid directly from the semiconductor chip impacts the surface at a sufficiently small angle as to be reflected back into the optical integrating cavity by total internal reflection at the surface of the light transmissive solid.

From a somewhat different perspective, the drawings and detailed description also disclose a solid state light emitting device that includes a semiconductor chip, a package enclosing the semiconductor chip, a reflective surface within the package and a light transmissive solid. Again, the chip is of a type or structure that produces near UV electromagnetic energy, specifically in a range of 380-420 nm. The reflective surface within the package forms an optical integrating cavity. The semiconductor chip is positioned and oriented so that at least substantially all direct emissions from the semiconductor chip reflect at least once within the cavity. The light transmissive solid fills at least a substantial portion of the optical integrating cavity. A surface of the light transmissive solid forms an optical aperture of the optical integrating cavity to allow emission of light for an output of the device. This type of device also includes phosphors. Each of the phosphors is of a type excited in response to near UV electromagnetic energy in the range of 380-420 nm. Each of the phosphors is of a type for re-emitting visible light of a different spectral characteristic outside (having substantially no overlap with) the absorption spectra of the phosphors. When excited by near UV electromagnetic energy from the semiconductor chip, the phosphors together produce visible light in the output of the device. That visible light output is at least substantially white, and that visible light output has a color rendering index (CRI) of 75 or higher.

In an exemplary implementation of such a solid state device, the phosphors are doped semiconductor nanophosphors as in the earlier examples. With the doped semiconductor nanophosphors, the device may be configured such that the white light output of the solid state light emitting device exhibits color temperature in one of the following specific ranges along the black body curve: 2,725±145° Kelvin; 3,045±175° Kelvin; 3,465±245° Kelvin; 3,985±275° Kelvin; 4,503±243° Kelvin; 5,028±283° Kelvin; 5,665±355° Kelvin; and 6,530±510° Kelvin. The reflective surface may be diffusely reflective.

Additional advantages and novel features will be set forth in part in the description which follows, and in part will become apparent to those skilled in the art upon examination of the following and the accompanying drawings or may be learned by production or operation of the examples. The advantages of the present teachings may be realized and attained by practice or use of various aspects of the methodologies, instrumentalities and combinations set forth in the detailed examples discussed below.

BRIEF DESCRIPTION OF THE DRAWINGS

The drawing figures depict one or more implementations in accord with the present teachings, by way of example only, not by way of limitation. In the figures, like reference numerals refer to the same or similar elements.

FIGS. 4A and 4B are tables showing the chromaticity specifications for the nominal values and CIE color temperature (CCT) ranges.

DETAILED DESCRIPTION

Figures 1, 2:
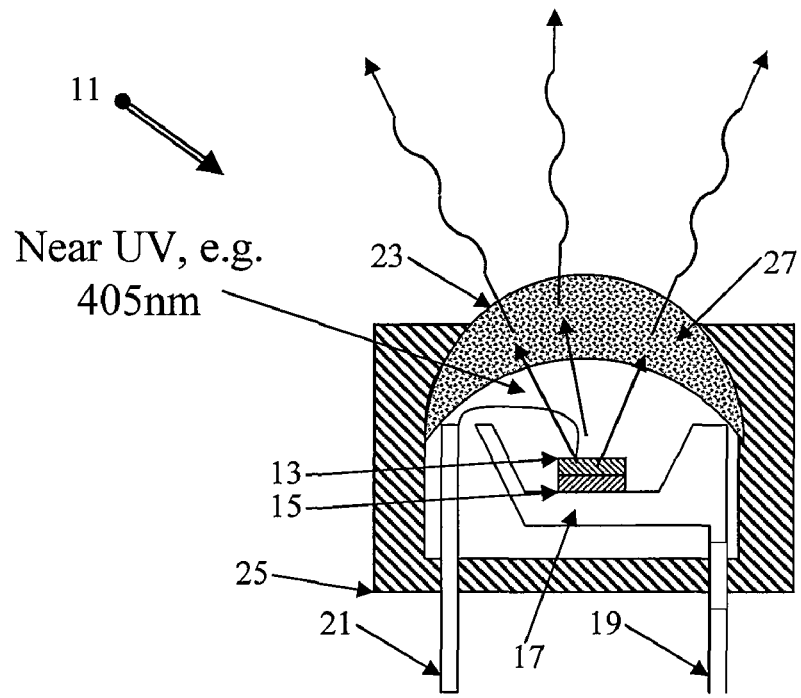
FIG. 1 is a simplified cross-sectional view of a light-emitting diode (LED) type solid state device, which uses a near UV semiconductor LED chip and doped semiconductor nanophosphors within the package enclosing the semiconductor chip to produce white light of the characteristics discussed herein.
FIG. 2 is a table showing the color temperature ranges and corresponding nominal color temperatures.

In the following detailed description, numerous specific details are set forth by way of examples in order to provide a thorough understanding of the relevant teachings. However, it should be apparent to those skilled in the art that the present teachings may be practiced without such details. In other instances, well known methods, procedures, components, and/or circuitry have been described at a relatively high-level, without detail, in order to avoid unnecessarily obscuring aspects of the present teachings.

The various solid state devices disclosed herein provide efficient generation and output of visible white light of characteristics that are highly desirable in general lighting applications and the like, using energy in a range of 380-420 nm to pump phosphors, such as doped semiconductor nanophosphors, for converting such energy into high quality visible white light. Such a device includes a semiconductor chip that produces electromagnetic energy in a range of 380-420 nm, which is a portion of the "near ultraviolet" or "near UV" part of the electromagnetic energy spectrum. Several examples use a near UV LED type semiconductor chip rated to produce electromagnetic energy at 405 nm.

Phosphors, doped semiconductor nanophosphors in several specific examples, are positioned in the chip packaging of the device for excitation by the near UV energy emitted by the chip. When the phosphors are pumped or excited, the combined light output of the solid state device is at least substantially white and has a color rendering index (CRI) of 75 or higher. Although sometimes referred to below simply as white light for convenience, the light output is "at least substantially" white in that it appears as visible white light to a human observer, although it may not be truly white in the electromagnetic sense in that it may exhibit some spikes or peaks and/or valleys or gaps across the relevant portion of the visible spectrum.

In the examples using the doped semiconductor nanophosphors, the output light of the device exhibits color temperature in one of the four following specific ranges along the black body curve: 2,725±145° Kelvin; 3,045±175° Kelvin; 3,465±245° Kelvin; 3,985±275° Kelvin; 4,503±243° Kelvin; 5,028±283° Kelvin; 5,665±355° Kelvin; and 6,530±510° Kelvin. High CRI white light of a color temperature in each of these particular ranges, for example, is highly useful, desirable and acceptable for many general lighting applications. General lighting applications include, for example, illumination of spaces or areas to be inhabited by people or of objects in or around such areas. Of course, the white light emitting solid state devices may be used in a variety of other light emission applications.

Before discussing structural examples, it may be helpful to discuss the types of phosphors of interest here. Semiconductor nanophosphors are nano-scale crystals or "nanocrystals" formed of semiconductor materials, which exhibit phosphorescent light emission in response to excitation by electromagnetic energy of an appropriate input spectrum (excitation or absorption spectrum). Examples of such nanophosphors include quantum dots (q-dots) formed of semiconductor materials. Like other phosphors, quantum dots and other semiconductor nanophosphors absorb light of one wavelength band and re-emit light at a different band of wavelengths. However, unlike conventional phosphors, optical properties of the semiconductor nanophosphors can be more easily tailored, for example, as a function of the size of the nanocrystals. In this way, for example, it is possible to adjust the absorption spectrum and/or the emission spectrum of the semiconductor nanophosphors by controlling crystal formation during the manufacturing process so as to change the size of the nanocrystals. For example, nanocrystals of the same material, but with different sizes, can absorb and/or emit light of different colors. For at least some semiconductor nanophosphor materials, the larger the nanocrystals, the redder the spectrum of re-emitted light; whereas smaller nanocrystals produce a bluer spectrum of re-emitted light.

Doped semiconductor nanophosphors are somewhat similar in that they are nanocrystals formed of semiconductor materials. However, this later type of semiconductor phosphors are doped, for example, with a transition metal or a rare earth metal. The doped semiconductor nanophosphors used in the exemplary solid state light emitting devices discussed herein are configured to convert energy in the near UV range of 380-420 nm into wavelengths of light, which together result in high CRI visible white light emission.

Semiconductor nanophosphors, including doped semiconductor nanocrystal phosphors, may be grown by a number of techniques. For example, colloidal nanocrystals are solution-grown, although non-colloidal techniques are possible.

In practice, a material containing or otherwise including doped semiconductor nanophosphors, of the type discussed in the examples herein, would contain several different types of doped semiconductor nanocrystals sized and/or doped so as to be excited by the near UV light energy. The different types of nanocrystals (e.g. semiconductor material, crystal size and/or doping properties) in the mixture are selected by their emission spectra, so that together the excited nanophosphors provide the high CRI white light of a rated color temperature when all are excited by the near UV light energy. Relative proportions in the mixture may also be chosen to help produce the desired output spectrum. The doped semiconductor nanophosphors exhibit a relatively large Stokes shift, from lower wavelength absorption spectra to higher wavelength emission spectra. In our examples, each of the phosphors is of a type excited in response to near UV electromagnetic energy in the range of 380-420 nm for re-emitting visible light of a different spectral characteristic, and each of the phosphor emission spectra has little or no overlap with absorption spectra of the phosphors. Because of the sizes of the shifts, the emissions are substantially free of any overlap with the absorption spectra of the phosphors, and re-absorption of light emitted by the phosphors can be reduced or eliminated, even in applications that use a mixture of a number of such phosphors to stack the emission spectra thereof so as to provide a desired spectral characteristic in the combined light output.

Reference now is made in detail to the examples illustrated in the accompanying drawings and discussed below. FIG. 1 illustrates an example of a visible white light type LED device, in cross section, by way of a first example 11 of a solid state device of the type discussed herein. The structural configuration of the solid state device 11 shown in FIG. 1 is presented here by way of example only. Those skilled in the art will appreciate that the device may utilize any device structure.

In the example, the solid state device 11 includes a semiconductor chip, comprising two or more semiconductor layers 13, 15 forming the actual LED. In our first example, the semiconductor layers 13, 15 of the chip are mounted on an internal reflective cup 17, formed as an extension of a first electrode, e.g. the cathode 19. The cathode 19 and an anode 21 provide electrical connections to layers of the semiconductor chip within the packaging for the device 11. When appropriate current is supplied through the cathode 19 and the anode 21 to the LED chip layers 15 and 13, the chip emits electromagnetic energy. In the example, an epoxy dome 23 (or similar transmissive part) of the enclosure allows for emission of the electromagnetic energy from the device 11 in the desired direction.

The chip structure shown is given by way of a simple example, only. Those skilled in the art will appreciate that the device 11 can utilize any semiconductor chip structure, where the chip is configured as a source of 380-420 nm near UV range electromagnetic energy, for example, having substantial energy emissions in that range such as a predominant peak at or about 405 nm. The simplified example shows a LED type semiconductor chip formed of two layers 13, 15. Those skilled in the art will recognize that actual chips may have a different number of device layers. Of note for our purposes, however, the LED type semiconductor chip is constructed so as to emit electromagnetic energy of a wavelength in the near UV range, in this case in the 380-420 nm range. By way of a specific example, we will assume that the layers 13, 15 of the LED chip are configured so that the LED emits electromagnetic energy with a main emission peak at 405 nm.

Semiconductor devices such as the light emitting device formed by layers 13, 15 exhibit emission spectra having a relatively narrow peak at a predominant wavelength, although some such devices may have a number of peaks in their emission spectra. Such devices may be rated with respect to the intended wavelength of the predominant peak, although there is some variation or tolerance around the rated value, from chip to chip due to manufacturing tolerances. The semiconductor chip in the solid state device 11 will have a predominant wavelength in the 380-420 nm range. For example, the chip in the example of FIG. 1 is rated for a 405 nm output, which means that it has a predominant peak in its emission spectra at or about 405 nm (within the manufacturer's tolerance range of that rated wavelength value). Examples of devices 11, however, may use chips that have additional peaks in their emission spectra.

In this simple example, the near UV solid state device 11 also includes a housing 25. The epoxy may substantially encapsulate the chip. The housing and the light transmissive dome 23 together form the package enclosing the LED chip, in this example. Typically, the housing 25 is metal, e.g. to provide good heat conductivity so as to facilitate dissipation of heat generated during operation of the LED. Internal reflectors, such as the reflective cup 17, direct energy in the desired direction and reduce internal losses.

The solid state light emitting device 11 also incorporates an appropriately formulated nanophosphor material within the device package itself, to enable the device 11 to produce the desired white light. The nanophosphor material includes a number of different types of doped semiconductor nanophosphors. The doped semiconductor nanophosphors are all excited by near UV light, however, the emission spectra of the different doped semiconductor nanophosphors are different. Each type of nanophosphors re-emits visible light of a different spectral characteristic, and each of the phosphor emission spectra has little or no overlap with excitation or absorption ranges of the nanophosphors. Particular doped semiconductor nanophosphors are chosen, in the specific examples, so that the resultant combined light output through the exposed surface of the dome 23 is white light having a CRI of 75 or higher and having a color temperature in a specific one of the four ranges recited above. Specific combinations of emission spectra of appropriate doped semiconductor nanophosphors will be discussed in more detail, later, with regard to FIGS. 5-7.

The doped semiconductor nanophosphors could be at various locations and formed in various ways within the package of the solid state device 11. For example, the phosphors could be part of or coated on a reflective material of the cup 17. In the illustrated example, however, the mix of doped semiconductor nanophosphors is located across the optical output of the solid state device 11, as shown at 27 in the drawing. The nanophosphors 27 for example could be in a coating over the outside of an epoxy dome, or the phosphor particles could be doped or otherwise embedded in a portion (as shown) or all of the epoxy forming the dome 23 itself. At least some semiconductor nanophosphors degrade in the presence of oxygen, reducing the useful life of the nanophosphors. Hence, it may be desirable to use materials and construct the device 11 so as to effectively encapsulate the doped semiconductor nanophosphors 27 in a manner that blocks out oxygen, to prolong useful life of the phosphors.

When the phosphors 27 are pumped by near UV light from the LED chip, the combined light output of the solid state device 11 is at least substantially white and has a color rendering index (CRI) of 75 or higher. As shown in the table in FIG. 2, the white output light of the device 11 exhibits color temperature in one of the four following specific ranges along the black body curve: 2,725±145° Kelvin; 3,045±175° Kelvin; 3,465±245° Kelvin; 3,985±275° Kelvin; 4,503±243° Kelvin; 5,028±283° Kelvin; 5,665±355° Kelvin; and 6,530±510° Kelvin. These ranges correspond to nominal color temperature values shown in the table. The nominal color temperature values represent the rated or advertised color temperatures as would apply to particular lighting fixture or system products having an output color temperature within the corresponding ranges.

Figure 3:
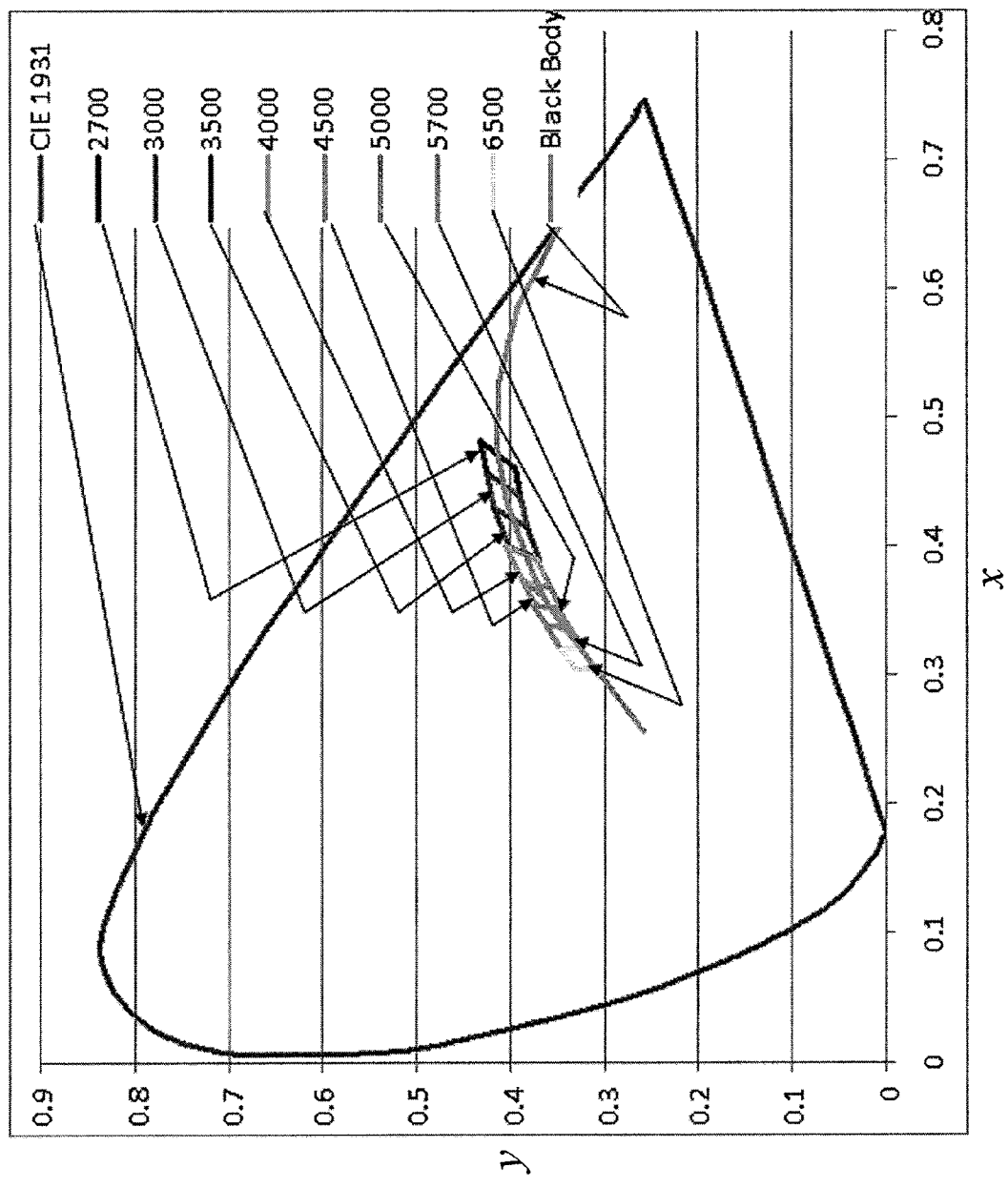
FIG. 3 is a color chart showing the black body curve and tolerance quadrangles along that curve for chromaticities corresponding to the desired color temperature ranges.

The color temperature ranges fall along the black body curve. FIG. 3 shows the outline of the CIE 1931 color chart, and the curve across a portion of the chart represents a section of the black body curve that includes the desired CIE color temperature (CCT) ranges. The light may also vary somewhat in terms of chromaticity from the coordinates on the black body curve. The quadrangles shown in the drawing represent the range of chromaticity for each nominal CCT value. Each quadrangle is defined by the range of CCT and the distance from the black body curve. The table in FIG. 4A provides a chromaticity specification for each of the first four color temperature ranges. The table in FIG. 4B provides a chromaticity specification for each of the other four color temperature ranges. The x, y coordinates define the center points on the black body curve and the vertices of the tolerance quadrangles diagrammatically illustrated in the color chart of FIG. 3.

The solid state light emitting device 11 could use a variety of different combinations of doped semiconductor nanophosphors to produce such an output. Examples of suitable materials, having the phosphor(s) in a silicone medium, are available from NN Labs of Fayetteville, Ark.

Figure 5:
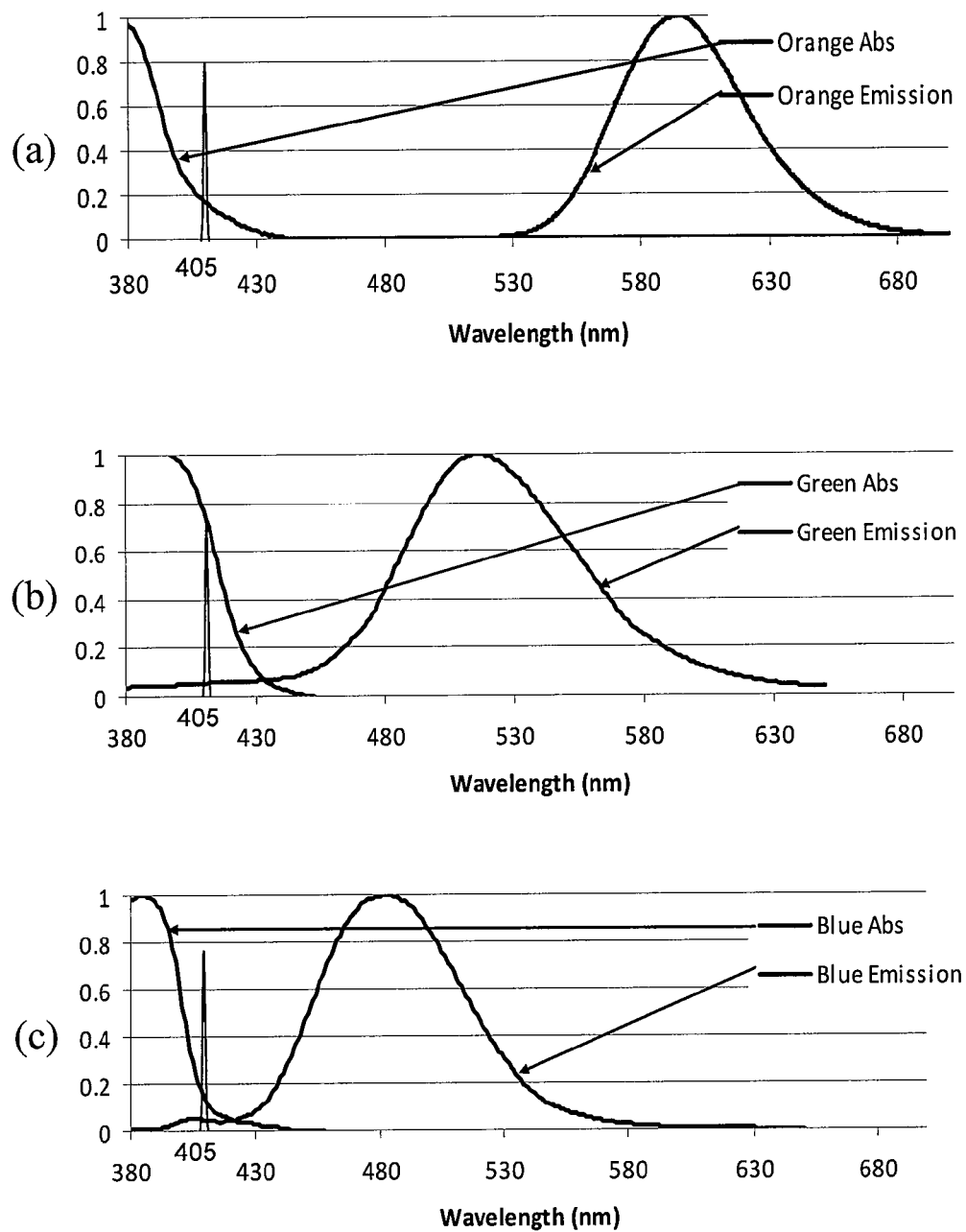
FIG. 5 is a graph of absorption and emission spectra of a number of doped semiconductor nanophosphors.

Doped semiconductor nanophosphors exhibit a large Stokes shift, that is to say from a short-wavelength range of absorbed energy up to a fairly well separated longer-wavelength range of emitted light. FIG. 5 shows the absorption and emission spectra of three examples of doped semiconductor nanophosphors. Each line of the graph also includes an approximation of the emission spectra of the 405 nm LED chip, to help illustrate the relationship of the 405 nm LED emissions to the absorption spectra of the exemplary doped semiconductor nanophosphors. The illustrated spectra are not drawn precisely to scale but in a manner to provide a teaching example to illustrate our discussion here.

The top line (a) of the graph shows the absorption and emission spectra for an orange emitting doped semiconductor nanophosphor. The absorption spectrum for this first phosphor includes the 380-420 nm near UV range, but that absorption spectrum drops substantially to 0 before reaching 450 nm. As noted, the phosphor exhibits a large Stokes shift from the short wavelength(s) of absorbed light to the longer wavelengths of re-emitted light. The emission spectrum of this first phosphor has a fairly broad peak in the wavelength region humans perceive as orange. Of note, the emission spectrum of this first phosphor is well above the illustrated absorption spectra of the other doped semiconductor nanophosphors and well above its own absorption spectrum. As a result, orange emissions from the first doped semiconductor nanophosphor would not re-excite that phosphor and would not excite the other doped semiconductor nanophosphors if mixed together. Stated another way, the orange phosphor emissions would be subject to little or no phosphor re-absorption, even in mixtures containing one or more of the other doped semiconductor nanophosphors.

The next line (b) of the graph of FIG. 5 shows the absorption and emission spectra for a green emitting doped nanocrystal doped semiconductor nanophosphor. The absorption spectrum for this second phosphor includes the 380-420 nm near UV range, but that absorption spectrum drops substantially to 0 a little below 450 nm. This phosphor also exhibits a large Stokes shift from the short wavelength(s) of absorbed light to the longer wavelengths of re-emitted light. The emission spectrum of this second phosphor has a broad peak in the wavelength region humans perceive as green. Again, the emission spectrum of the phosphor is well above the illustrated absorption spectra of the other doped semiconductor nanophosphors and well above its own absorption spectrum. As a result, green emissions from the second doped semiconductor nanophosphor would not re-excite that phosphor and would not excite the other doped semiconductor nanophosphors if mixed together. Stated another way, the green phosphor emissions also should be subject to little or no phosphor re-absorption, even in mixtures containing one or more of the other doped semiconductor nanophosphors.

The bottom line (c) of the graph of FIG. 5 shows the absorption and emission spectra for a blue emitting doped semiconductor nanophosphor. The absorption spectrum for this third phosphor includes the 380-420 nm near UV range, but that absorption spectrum drops substantially to 0 between 400 and 450 nm. This phosphor also exhibits a large Stokes shift from the short wavelength(s) of absorbed light to the longer wavelengths of re-emitted light. The emission spectrum of this third phosphor has a broad peak in the wavelength region humans perceive as blue. The main peak of the emission spectrum of the phosphor is well above the illustrated absorption spectra of the other doped semiconductor nanophosphors and well above its own absorption spectrum. In the case of the blue example, there is just a small amount of emissions in the region of the phosphor absorption spectra. As a result, blue emissions from the third doped semiconductor nanophosphor would not re-excite that phosphor and the other doped semiconductor nanophosphors at most a minimal amount. As in the other phosphor examples of FIG. 5, the blue phosphor emissions would be subject to relatively little phosphor re-absorption, even in mixtures containing one or more of the other doped semiconductor nanophosphors.

Examples of suitable orange, green and blue emitting doped semiconductor nanophosphors of the types generally described above relative to FIG. 3 are available from NN Labs of Fayetteville, Ark.

As explained above, the large Stokes shift results in negligible re-absorption of the visible light emitted by doped semiconductor nanophosphors. This allows the stacking of multiple phosphors. It becomes practical to select and mix two, three or more such phosphors in a manner that produces a particular desired spectral characteristic in the combined light output generated by the phosphor emissions.

Figure 6:
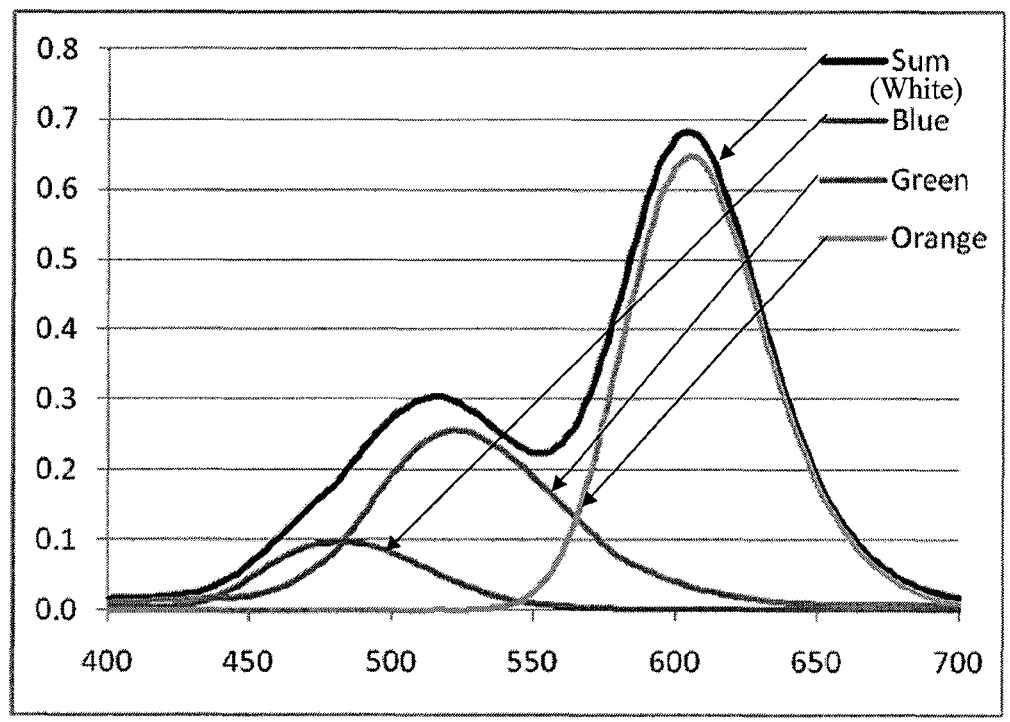
FIG. 6 is a graph of emission spectra of three of the doped semiconductor nanophosphors, selected for use in an exemplary solid state light emitting device, as well as the spectrum of the white light produced by combining the spectral emissions from those three nanophosphors.
Figure 7:
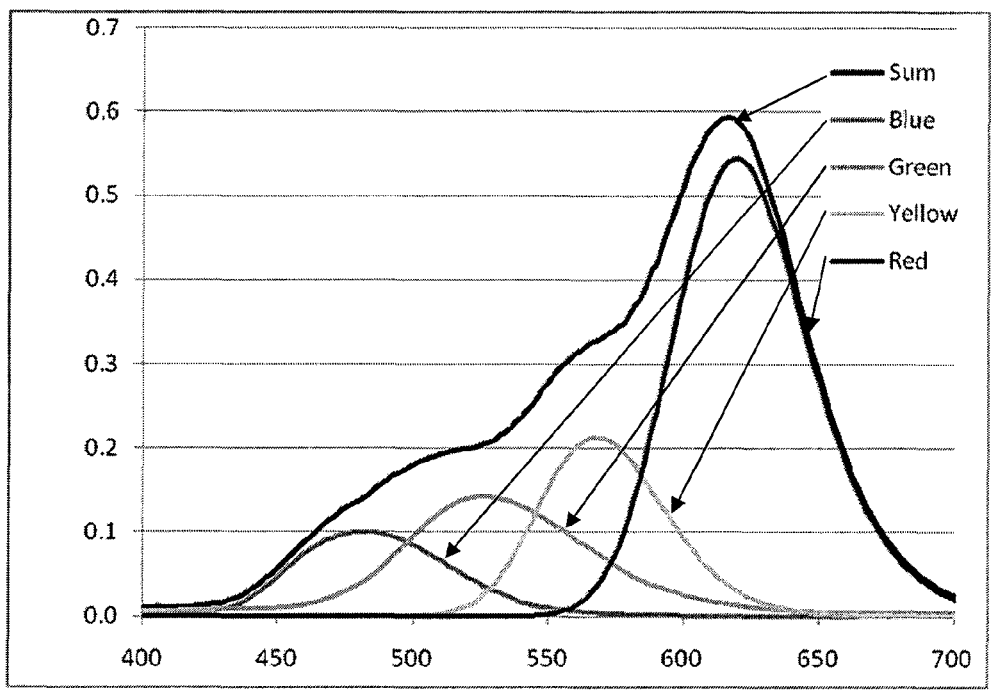
FIG. 7 is a graph of emission spectra of four doped semiconductor nanophosphors, in this case, for red, green, blue and yellow emissions, as the spectrum of the white light produced by combining the spectral emissions from those four phosphors.

FIG. 6 graphically depicts emission spectra of three of the doped semiconductor nanophosphors selected for use in an exemplary solid state light emitting device as well as the spectrum of the white light produced by summing or combining the spectral emissions from those three phosphors. For convenience, the emission spectrum of the LED has been omitted from FIG. 6, on the assumption that a high percentage of the 405 nm light from the LED is absorbed by the phosphors. Although the actual output emissions from the device 11 may include some near UV light from the LED, the contribution thereof if any to the sum in the output spectrum should be relatively small.

Although other combinations are possible based on the phosphors discussed above relative to FIG. 5 or based on other semiconductor nanocrystal phosphors, the example of FIG. 6 represents emissions of blue, green and orange phosphors. The emission spectra of the blue, green and orange emitting doped semiconductor nanophosphors are similar to those of the corresponding color emissions shown in FIG. 5. Light is additive. Where the solid state device 11 includes the blue, green and orange emitting doped semiconductor nanophosphors as shown for example at 27 in FIG. 1, the addition of the blue, green and orange emissions produce a combined spectrum as approximated by the top or 'Sum' curve in the graph of FIG. 6.

It is possible to add one or more additional nanophosphors, e.g. a fourth, fifth, etc., to the mixture to further improve the CRI. For example, to improve the CRI of the nanophosphor mix of FIGS. 5 and 6, a doped semiconductor nanophosphor might be added to the mix with a broad emissions spectrum that is yellowish-green or greenish-yellow, that is to say with a peak of the phosphor emissions somewhere in the range of 540-570 nm, say at 555 nm.

Other mixtures also are possible, with two, three or more doped semiconductor nanophosphors. The example of FIG. 7 uses red, green and blue emitting semiconductor nanophosphors, as well as a yellow fourth doped semiconductor nanophosphor. Although not shown, the absorption spectra would be similar to those of the three nanophosphors discussed above relative to FIG. 5. For example, each absorption spectrum would include at least a portion of the 380-420 nm near UV range. All four phosphors would exhibit a large Stokes shift from the short wavelength(s) of absorbed light to the longer wavelengths of re-emitted light, and thus their emissions spectra have little or not overlap with the absorption spectra.

In this example (FIG. 7), the blue nanophosphor exhibits an emission peak at or around 484, nm, the green nanophosphor exhibits an emission peak at or around 516 nm, the yellow nanophosphor exhibits an emission peak at or around 580, and the red nanophosphor exhibits an emission peak at or around 610 nm. The addition of these blue, green, red and yellow phosphor emissions produces a combined spectrum as approximated by the top or 'Sum' curve in the graph of FIG. 7. The 'Sum' curve in the graph represents a resultant white light output having a color temperature of 2600° Kelvin (within the 2,725±145° Kelvin range), where that white output light also would have a CRI of 88 (higher than 75).

Various mixtures of doped semiconductor nanophosphors will produce white light emissions from solid state devices 11 that exhibit CRI of 75 or higher. For an intended device specification, a particular mixture of phosphors is chosen so that the light output of the device exhibits color temperature in one of the following specific ranges along the black body curve: 2,725±145° Kelvin; 3,045±175° Kelvin; 3,465±245° Kelvin; 3,985±275° Kelvin; 4,503±243° Kelvin; 5,028±283° Kelvin; 5,665±355° Kelvin; and 6,530±510° Kelvin. In the example shown in FIG. 6, the 'Sum' curve in the graph produced by the mixture of blue, green and orange emitting doped semiconductor nanophosphors would result in a white light output having a color temperature of 2800° Kelvin (within the 2,725±145° Kelvin). That white output light also would have a CRI of 80 (higher than 75).

Returning to FIG. 1, assume that the phosphors at 27 in the device 11 include the blue, green and orange emitting doped semiconductor nanophosphors discussed above relative to FIGS. 2 and 3. As discussed earlier, the semiconductor LED chip formed by layers 13 and 15 is rated to emit near UV electromagnetic energy of a wavelength in the 380-420 nm range, such as 405 nm in the illustrated example, which is within the excitation spectrum of each of the three included phosphors in the mixture shown at 27. When excited, that combination of doped semiconductor nanophosphors re-emits the various wavelengths of visible light represented by the blue, green and orange lines in the graph of FIG. 6. Combination or addition thereof in the device output produces "white" light, which for purposes of our discussion herein is light that is at least substantially white light. The white light emission from the solid state device 11 exhibits a CRI of 75 or higher (80 in the specific example of FIG. 6). Also, the light output of the device 11 exhibits color temperature of 2800° Kelvin, that is to say within the 2,725±145° Kelvin range. Other combinations of doped semiconductor nanophosphors can be used in a device 11 to produce the high CRI white light in the 3,045±175° Kelvin, 3,465±245° Kelvin, 3,985±275° Kelvin, 4,503±243° Kelvin, 5,028±283° Kelvin, 5,665±355° Kelvin, and 6,530±510° Kelvin ranges.

Hence, the solid state device 11 is a white light type device, even though internally the semiconductor chip is a near UV LED. The light output of the solid state device 11 is high quality white light suitable for general lighting applications and the like. Of course, the white light from the source 11 may be used in many other applications. Depending on the particular application, the white light solid state device 11 may be used directly as a white light source, or the device 11 can be combined with an appropriate external optic (reflector, diffuser, lens, prism, etc., not shown) to form a light fixture or the like.

The structure of the solid state device shown in FIG. 1 is given by way of example only. Those skilled in the art will recognize that the near UV semiconductor chip and the doped semiconductor nanophosphors may be implemented in any of a wide range of device designs, including many structures known for LED type devices that have previously incorporated semiconductor nanophosphors or other types of phosphors. A particularly advantageous approach to the device design, however, would include at least one diffusely reflective surface within the package forming an optical integrating cavity. The semiconductor chip would be positioned and oriented so that at least substantially all direct emissions from the semiconductor chip reflect at least once within the cavity. Emissions from the doped semiconductor nanophosphors within the device also would be reflected and integrated within the cavity.

Figure 8:
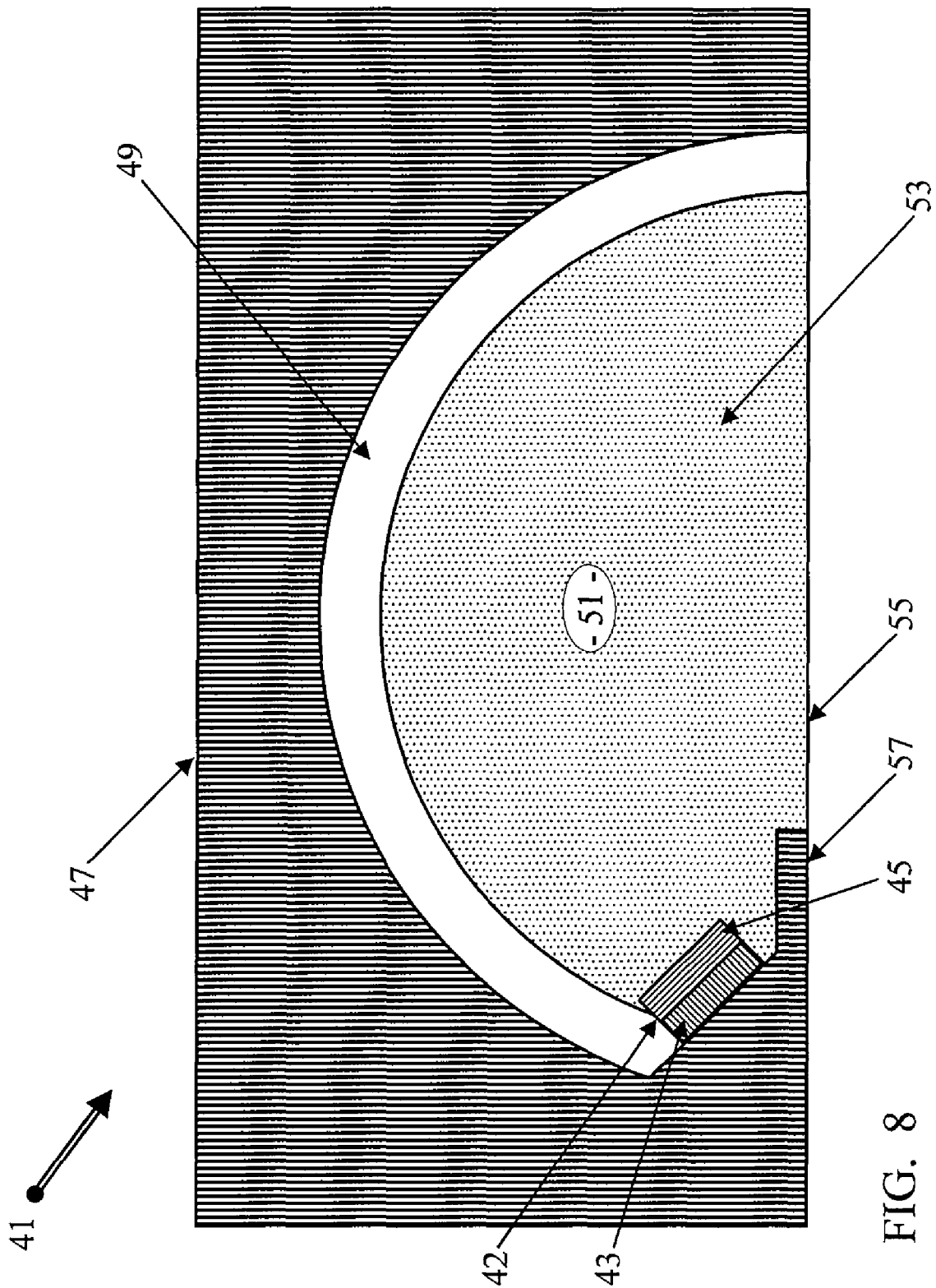
FIG. 8 is a simplified cross-sectional view of another structure for a light-emitting diode (LED) type lighting device, here incorporating a solid-filled optical integrating cavity.

To fully appreciate this further enhancement and its advantages, it may be helpful to discuss a simplified example, such as represented in cross-section in FIG. 8. In the example, the solid state device 41 includes a semiconductor chip 42, comprising by way of a simple example the two semiconductor layers 43, 45. The two or more semiconductor layers form the actual emitter, in this case a LED. The chip 42 is similar to that formed by the exemplary layers 13 and 15 in the device 11 of FIG. 1. A single chip 42 is shown for simplicity, although the device 41 could include one or more additional semiconductor chips. Again, the LED type semiconductor chip 42 is constructed so as to emit electromagnetic energy of a wavelength in the near UV range, in this case in the 380-420 nm range. By way of a specific example, we will assume that the layers of the LED chip 42 are configured so that the LED emits electromagnetic energy with a main emission peak at 405 nm.

The semiconductor chip 42 is mounted on an internal reflective cup, in this case formed by a region of the metal housing member 47 (including a mask 57, as discussed more later). The metal housing 47 also dissipates heat generated by the chip 42 during its operation. In this example, we have assumed that the metal housing (heat slug) 47 of the solid state white light emitter device 41 is conductive and provides the connection lead to the layer 43, otherwise, connection leads to various layers of the chip have been omitted, for ease of illustration and discussion. Of course, a variety of other configurations for mounting the chip and providing electrical connections and heat dissipation may be used.

In this example, the orientation of the chip relative to the optical output of the device 41 is quite different from that of the device 11 of FIG. 1. The configuration of the device in FIG. aims the emissions from the chip toward the optical output of the device 11 as much as possible and minimizes reflections within the device. The structure of the device 41 positions and orients the chip so that direct emissions through the optical output are minimal or eliminated and light directly emitted from the chip excites phosphors and/or reflects one or more times within the device.

The chip housing member 47 is configured to form a volume, and there is a reflector 49 at the surface of the member 47 forming that volume. The reflector 49 may be formed in a number of different ways, for example, by polishing and/or etching the surface, or by coating the surface with an appropriately reflective material. Preferably, the reflector 49 is diffusely reflective with respect to the wavelengths involved in operation of the device 41. The reflector 49 forms a reflective volume within the device 41 forming an optical cavity 51.

The cavity 51 may have various shapes. Examples having shapes corresponding to a portion or segment of a sphere or cylinder are preferred for ease of illustration and/or because curved surfaces provide better efficiencies than other shapes that include more edges and corners which tend to trap light. Those skilled in the art will understand, however, that the volume of the cavity of the device 41 may have any shape providing adequate reflections within the volume/cavity 51 for a particular lighting application.

For purposes of further discussion, we will assume that the material forming the reflector 49 is diffusely reflective. It is desirable that the cavity surface or surfaces have a highly efficient reflective characteristic, e.g. a reflectivity equal to or greater than 90%, e.g. approximately 97-99% reflective, with respect to energy in at least the visible and near-ultraviolet portions of the electromagnetic spectrum.

In the solid state device 41, the volume of the optical integrating cavity 51 is filled by a light transmissive solid material 53. The material forming the light transmissive solid 53 may be similar to that of the epoxy dome 23 in the earlier example, although other materials may be used here to fill the cavity. The chip housing member 47 and the light transmissive solid 53 together form the package enclosing the LED chip 42 and the reflector 49, in this example. The light transmissive solid 53 may be transparent or somewhat diffuse (milky or translucent).

The light transmissive solid 53 fills the cavity volume and thus has a contoured outer surface that closely conforms to the inner surface of the reflector 49. The light transmissive solid 53 also has an optical aperture surface 55. Although there may be other elements forming the optic of the device 41, in the example, the surface 55 which forms an optical aperture for passage of light out of the cavity 51 also serves as the optical output of the solid state device 41. The surface 55 may be convex or concave, or have other contours, but in the example, the surface 55 is flat.

The optical aperture at surface 55 in this example approximates a circle, although other shapes are possible. One or more additional elements (not shown) may be provided at or coupled to the aperture 55, such as a deflector, diffuser or filter. If a filter is provided, for example, the filter at the aperture 55 might allow passage of visible light but block UV emissions from the cavity 51. The optical aperture surface may be transparent, or that surface may have a somewhat roughened or etched texture.

The semiconductor chip 42 is positioned and oriented relative to the light transmissive solid 53 so that any near UV electromagnetic energy reaching the aperture surface 55 of the light transmissive solid 53 directly from the chip 42 impacts the surface 55 at a sufficiently small angle as to be reflected back into the optical integrating cavity 55 by total internal reflection at the surface of the light transmissive solid 53.

Although it may not be necessary in all implementations, depending on the precise location and orientation, the exemplary device 41 also includes a mask 57 having a reflective surface facing into the optical integrating cavity 51, which somewhat reduces the area of the solid surface forming the light transmissive output passage (optical aperture) shown at 55. As noted, the surface of the mask 57 that faces into the optical integrating volume 51 (faces upward in the illustrated orientation) is reflective. That surface may be diffusely reflective, much like the surface of the reflector 49, or that mask surface may be specular, quasi specular or semi-specular.

Due to the total internal reflection of the solid surface forming the optical aperture 55, the mask 57 can be relatively small in that it only needs to extend far enough out so as to block direct view of the LED through the aperture 55 and to reflect those few direct emissions of the LED that might otherwise still impact the surface 55 at too high or large an angle for total internal reflection. In this way, the combination of total internal reflection of the aperture surface 55 of the solid 53 together with the reflective mask 57 reflects all or at least substantially all of the direct emissions from the LED, that otherwise would miss the surface of the reflector 49, back into the optical integrating volume 51. Stated another way, a person viewing the device 41 during emissive operation would not perceive the near UV LED chip 42 as a visible individual point light source. Instead, virtually all light input to the volume of the cavity 51 from the semiconductor chip 42 will diffusely reflect one or more times from the surface of the reflector 49 before emergence through the aperture at the surface 55 of the solid 53. Since the surface of the reflector 49 provides diffuse reflectivity, the volume 51 acts as an optical integrating cavity so that the aperture surface 55 forms an optical aperture providing a substantially uniform virtual source output distribution of integrated light (e.g. substantially Lambertian) across the area of the aperture surface.

To this point we have focused on the structure and optical aspects of the solid state light emitter 41. However, like the device 11 in the earlier example, the device 41 includes phosphors, such as doped semiconductor nanophosphors, for converting the near UV energy from the chip 42 into visible white light, with a color rendering index (CRI) of 75 or higher. By using one of the mixtures of doped semiconductor nanophosphors, like those in the earlier examples, the white output light may exhibit a color temperature in one of the several specific ranges along the black body curve. Again, it may be desirable to use materials and construct the device 11 so as to effectively encapsulate the doped semiconductor nanophosphors in a manner that blocks out oxygen, to prolong useful life of the phosphors.

The phosphors may be embodied in the device 41 in any of a variety of ways deemed advantageous or convenient. For example, the doped semiconductor nanophosphors could be doped or otherwise embedded in the material of the reflector 49. Alternatively, the phosphors could be applied as a coating between the surface of the reflector 49 and the matching contoured surface of the light transmissive solid 53. Another approach might be to place the phosphors on or around the semiconductor chip 42. Yet another approach might be to coat the doped semiconductor nanophosphors on the surface 55, although that would not take the best advantage of the integrating property of the cavity 51. In the example of FIG. 8, it is assumed that the solid state light emitting device 41 includes doped semiconductor nanophosphors that are doped or otherwise embedded in the light transmissive solid 53. The phosphors may be fairly widely dispersed throughout the solid 53 to minimize visible discoloration caused by the phosphors when the device is off.

In the example of FIG. 8, the semiconductor chip 42 emits 405 nm near UV energy mostly toward the inner surface of reflector 49. 405 nm emitted from the chip 42 in other directions is reflected by the inner surface of the mask 57 or total internal reflection at the optical aperture surface 55 towards the inner surface of reflector 49. As the 405 nm light from the chip 42 and from the mask 57 and the surface 55 passes through the light transmissive solid 53, it excites the doped semiconductor nanophosphors in the solid 53. Any 405 nm light that has not yet excited a phosphor reflects from the diffusely reflective surface of the reflector 49 back through the solid 53 and may excite the doped semiconductor nanophosphors in the solid 53 on the second or subsequent pass. Light produced by the phosphor excitations, is emitted in all directions within the cavity 51. Much of that light is also reflected one or more times from the inner surface of reflector 49, the inner surface of the mask 57 and the total internal reflection at the surface 55. At least some of those reflections, particularly those off the inner surface of reflector 49, are diffuse reflections. In this way, the cavity 51 integrates the light produced by the various phosphor emissions into a highly integrated light for output via the optical aperture at surface 55 (when reaching the surface at a steep enough angle to overcome the total internal reflection).

This optical integration by diffuse reflection within the cavity 51 integrates the light produced by the nano-phosphor excitation to form integrated light of the desired characteristics at the optical aperture 55 providing a substantially uniform output distribution of integrated light (e.g. substantially Lambertian) across the area of the aperture. As in the earlier examples, the particular doped semiconductor nanophosphors in the device 41 result in a light output that is at least substantially white and has a color rendering index (CRI) of 75 or higher. The white light output of the solid state device 41 through optical aperture 55 exhibits color temperature in one of the specified ranges along the black body curve. The doped semiconductor nanophosphors may be selected and mixed to stack the emissions spectra thereof so that the white light output through optical aperture 55 exhibits color temperature of 2,725±145° Kelvin. Alternatively, the doped semiconductor nanophosphors may be selected and mixed to stack the emissions spectra thereof so that the white light output through optical aperture 55 exhibits color temperature of 3,045±175° Kelvin. As yet another alternative, the doped semiconductor nanophosphors may be selected and mixed to stack the emissions spectra thereof so that the white light output through optical aperture 55 exhibits color temperature of 3,465±245° Kelvin. As a further alternative, the doped semiconductor nanophosphors may be selected and mixed to stack the emissions spectra thereof so that the white light output through optical aperture 55 exhibits color temperature of and 3,985±275° Kelvin. The doped semiconductor nanophosphors may be selected and mixed to stack the emissions spectra thereof so that the white light output through optical aperture 55 exhibits color temperature of 4,503±243° Kelvin; or the doped semiconductor nanophosphors may be selected and mixed to stack the emissions spectra thereof so that the white light output through optical aperture 55 exhibits color temperature of 5,028±283° Kelvin. As yet further alternatives, the doped semiconductor nanophosphors may be selected and mixed to stack the emissions spectra thereof so that the white light output through optical aperture 55 exhibits color temperature of 5,665±355° Kelvin; or the doped semiconductor nanophosphors may be selected and mixed to stack the emissions spectra thereof so that the white light output through optical aperture 55 exhibits color temperature of 6,530±510° Kelvin.

The effective optical aperture at 55 forms a virtual source of white light from the solid state device 41. The integration tends to form a relatively Lambertian distribution across the virtual source, in this case, the full area of the optical aperture at surface 55. Depending of design constraints of the device manufacture/market place, the aperture area may be relatively wide without exposing the chip as an intense visible point source within the device. When the device is observed in operation, the virtual source at 55 appears to have substantially infinite depth of the integrated light. The optical integration sufficiently mixes the light so that the light output exhibits a relatively low maximum-to-minimum intensity ratio across that optical aperture 55. In virtual source examples discussed herein, the virtual source light output exhibits a maximum-to-minimum ratio of 2 to 1 or less over substantially the entire optical output area.

Nano-phosphors, including the doped semiconductor nanophosphors used herein, produce relatively uniform repeatable emission spectra. Thus, having chosen an appropriate phosphor mixture to produce light of the desired CRI and color temperature, the solid state devices using that nano-phosphor may consistently produce white light having the CRI in the same range and color temperature in the same range with less humanly perceptible variation between devices as has been experienced with prior LED devices and the like.

While the foregoing has described what are considered to be the best mode and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

What is claimed is:

1. A solid state light emitting device, comprising:
    a semiconductor chip for producing electromagnetic energy in a range of 380-420 nm;
    a package enclosing the semiconductor chip and configured to allow emission of light as an output of the device;
    at least one reflective surface within the package forming an optical integrating cavity, wherein the semiconductor chip is positioned and oriented so that at least substantially all direct emissions from the semiconductor chip reflect at least once within the cavity;
    a light transmissive solid filling at least a substantial portion of the optical integrating cavity, wherein a surface of the light transmissive solid forms an optical aperture of the optical integrating cavity;
    a plurality of doped semiconductor nanophosphors within the package enclosing the semiconductor chip, each of the doped semiconductor nanophosphors:
        including nanocrystals formed of semiconductor materials which are doped with an impurity,
        being excited in response to electromagnetic energy in the range of 380-420 nm for re-emitting visible light of a different spectrum having substantially no overlap with absorption spectra of the doped semiconductor nanophosphors, and
        for together producing visible light in the output of the device when the doped semiconductor nanophosphors are excited by electromagnetic energy from the semiconductor chip,
    wherein:
        (a) the visible light output produced during the excitation of the doped semiconductor nanophosphors is at least substantially white;
        (b) the visible light output produced during the excitation of the doped semiconductor nanophosphors has a color rendering index (CRI) of 75 or higher; and
        (c) the visible light output produced during the excitation of the doped semiconductor nanophosphors has a color temperature in one of the following ranges:
            2,725±145° Kelvin;
            3,045±175° Kelvin;
            3,465±245° Kelvin;
            3,985±275° Kelvin;
            4,503±243° Kelvin;
            5,028±283° Kelvin;
            5,665±355° Kelvin; and
            6,530±510° Kelvin,
    the semiconductor chip is positioned and oriented relative to the light transmissive solid so that any electromagnetic energy reaching the optical aperture surface of the light transmissive solid directly from the semiconductor chip impacts the optical aperture surface at a sufficiently small angle as to be reflected back into the optical integrating cavity by total internal reflection at the optical aperture surface of the light transmissive solid.

2. The solid state light emitting device of claim 1, wherein the plurality of doped semiconductor nanophosphors further comprises a doped semiconductor nanophosphor excited in response to electromagnetic energy in the range of 380-420 nm for re-emitting yellowish-green or greenish-yellow light.

3. The solid state light emitting device of claim 1, wherein the visible light output produced during the excitation of the doped semiconductor nanophosphors has a CRI of at least 80.

4. The light fixture of claim 1, wherein the visible light output produced during the excitation of the doped semiconductor nanophosphors has a CRI of at least 88.

5. The solid state light emitting device of claim 1, wherein the semiconductor chip is configured for producing electromagnetic energy of 405 nm.

6. The solid state light emitting device of claim 1, further comprising:
    at least one reflective surface within the package forming an optical integrating cavity;
    wherein the semiconductor chip is positioned and oriented so that at least substantially all direct emissions from the semiconductor chip reflect at least once within the cavity.

7. The solid state light emitting device of claim 6, wherein the at least one reflective surface is diffusely reflective.

8. The solid state light emitting device of claim 6, further comprising:
    a light transmissive solid filling at least a substantial portion of the optical integrating cavity; wherein:
    a surface of the light transmissive solid forms an optical aperture of the optical integrating cavity.

9. The solid state light emitting device of claim 1, wherein the plurality of doped semiconductor nanophosphors are embedded in the light transmissive solid.

10. A solid state light emitting device, comprising:
    a semiconductor chip for producing electromagnetic energy in a range of 380-420 nm;
    a package enclosing the semiconductor chip;
    at least one reflective surface forming an optical integrating cavity within the package, wherein the semiconductor chip is positioned and oriented so that at least substantially all direct emissions from the semiconductor chip reflect at least once within the cavity;
    a light transmissive solid filling at least a substantial portion of the optical integrating cavity, wherein a surface of the light transmissive solid forms an optical aperture of the optical integrating cavity to allow emission of light from the cavity for a light output of the device; and
    a plurality of phosphors, each of the phosphors being excited in response to electromagnetic energy in the range of 380-420 nm for re-emitting visible light of a different spectrum having substantially no overlap with absorption spectra of the phosphors, for together producing visible light in the light output of the device when the phosphors are excited by electromagnetic energy from the semiconductor chip, wherein:

(a) the visible light output produced during the excitation of the phosphors is at least substantially white; and (b) the visible light output produced during the excitation of the phosphors has a color rendering index (CRI) of 75 or higher, and the semiconductor chip is positioned and oriented relative to the light transmissive solid so that any electromagnetic energy reaching the optical aperture surface of the light transmissive solid directly from the semiconductor chip impacts the optical aperture surface at a sufficiently small angle as to be reflected back into the optical integrating cavity by total internal reflection at the optical aperture surface of the light transmissive solid.

11. The solid state light emitting device of claim 10, wherein the at least one reflective surface is diffusely reflective.

12. The solid state light emitting device of claim 10, wherein the phosphors are embedded in the light transmissive solid.

13. The solid state light emitting device of claim 10, wherein the visible light output produced during the excitation of the phosphors has a CRI of at least 80.

14. The solid state light emitting device of claim 10, wherein the visible light output produced during the excitation of the phosphors has a CRI of at least 88.

15. The solid state light emitting device of claim 10, wherein the semiconductor chip is configured for producing electromagnetic energy of 405 nm.

16. The solid state light emitting device of claim 10, wherein the plurality of phosphors are doped semiconductor nanophosphors.

17. The solid state light emitting device of claim 10, wherein the visible light output produced during the excitation of the phosphors has a color temperature in one of the following ranges:
    2,725±145° Kelvin;
    3,045±175° Kelvin;
    3,465±245° Kelvin;
    3,985±275° Kelvin;
    4,503±243° Kelvin;
    5,028±283° Kelvin;
    5,665±355° Kelvin; and
    6,530±510° Kelvin.

* * * * *